(12) United States Patent
Lee et al.

(10) Patent No.: US 8,402,916 B2
(45) Date of Patent: Mar. 26, 2013

(54) DEPOSITION MASK

(75) Inventors: Sang-Shin Lee, Yongin (KR); Jung-Woo Ko, Yongin (KR); Taek-Kyo Kang, Yongin (KR); Seung-Ju Hong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 466 days.

(21) Appl. No.: 12/707,107

(22) Filed: Feb. 17, 2010

(65) Prior Publication Data

US 2010/0224125 A1 Sep. 9, 2010

(30) Foreign Application Priority Data

Mar. 3, 2009 (KR) .................. 10-2009-0018203

(51) Int. Cl.
*B05C 11/00* (2006.01)
*C23C 14/04* (2006.01)
(52) U.S. Cl. ...................................................... 118/504
(58) Field of Classification Search .................. None
See application file for complete search history.

(56) References Cited

U.S. PATENT DOCUMENTS

| 5,224,139 A * | 6/1993 | Korenaga et al. | 378/34 |
| 5,800,949 A * | 9/1998 | Edo et al. | 430/5 |
| 2002/0043918 A1* | 4/2002 | Lee | 313/407 |

FOREIGN PATENT DOCUMENTS

| CN | 1324097 A | 11/2001 |
| JP | 2005-339858 | 12/2005 |
| JP | 2010-135269 A | 6/2010 |
| KR | 10-2003-0085188 | 11/2003 |
| KR | 10-2006-0102838 | 9/2006 |
| KR | 10-2006-0114602 | 11/2006 |
| KR | 10-2007-0064906 | 6/2007 |
| WO | WO 2007/073072 | 6/2007 |

* cited by examiner

*Primary Examiner* — Dah-Wei Yuan
*Assistant Examiner* — Stephen Kitt
(74) *Attorney, Agent, or Firm* — Christie, Parker & Hale, LLP

(57) ABSTRACT

A deposition mask that includes a mask sheet and a frame to support the perimeter of the mask sheet. The frame includes a contact surface that is attached to the mask sheet, and a non-contact surface that faces and is spaced apart from the mask sheet, the non-contact portion extends from the contact portion, to an opening formed in the center of the frame. The non-contact portion may form an acute angle, with respect to the plane of the mask sheet.

12 Claims, 3 Drawing Sheets

DEPOSITION MASK

CROSS-REFERENCE TO RELATED APPLICATION

This application claims the benefit of Korean Patent Application No. 10-2009-0018203, filed Mar. 3, 2009, the disclosure of which is incorporated herein, by reference.

BACKGROUND OF THE INVENTION

1. Field of the Invention

Aspects of the present invention relate to a deposition mask.

2. Description of the Related Art

Among various methods of forming a thin film of a display device, a method of forming a thin film pattern, by depositing a target material using a mask, is commonly used. Common deposition using a mask is performed by aligning a mask on a deposition substrate, for example, a substrate of a display device, and applying a target material to the deposition substrate, through the mask, to form a thin film having a desired pattern on the deposition substrate.

A mask includes a frame and a mask sheet fixed to the frame and having a predetermined pattern. Generally, the frame has a predetermined thickness, a square shape, and an opening formed its center. An edge of the mask sheet is in contact with, and fixed to, the frame, thereby forming the mask.

The mask formed as such is stacked onto a deposition substrate, and a thin film is formed by depositing a target material on the deposition substrate. The thin film has a pattern that corresponds to a pattern formed on the mask sheet. Thus, for fine deposition, the mask may be closely adhered to the deposition substrate.

However, contaminants may be inserted between the mask frame and the mask sheet, while forming or using the mask. Such contamination may prevent the mask from being properly positioned on the deposition substrate. That is, when the mask is stacked on the deposition substrate, the contamination forms a gap between the mask and the deposition substrate. Due to the gap, the patterning of the thin film is disrupted, due to the generation of a shadow during patterning, which results in defects.

SUMMARY OF THE INVENTION

Aspects of the present invention provide a deposition mask that prevents contaminants disposed between a mask frame and a mask sheet from disrupting a patterning operation.

According to an exemplary embodiment of the present invention, a deposition mask includes: a mask sheet; and a frame in contact with, and fixed to, the perimeter of the mask sheet. The frame includes a contact surface that is attached to the mask sheet, and a non-contact surface that extends between the contact surface and a hole formed in the center of the frame. The non-contact surface may be angled with respect to the plane of the mask sheet.

According to another exemplary embodiment of the present invention, a deposition mask includes: a mask sheet; and a frame in contact with, and fixed to, the mask sheet. The frame includes a main body having a non-contact surface, and a projection that extends from the main body and forms a contact surface that is attached to the mask sheet.

According to still another exemplary embodiment of the present invention, a deposition mask includes: a mask sheet; and a frame in contact with, and fixed to, the perimeter of the mask sheet. The frame includes a contact surface that is attached to the mask sheet, and a non-contact surface that extends from the contact surface, and forms an angle with respect to the plane of the mask sheet.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EXEMPLARY EMBODIMENTS

Figure 1:
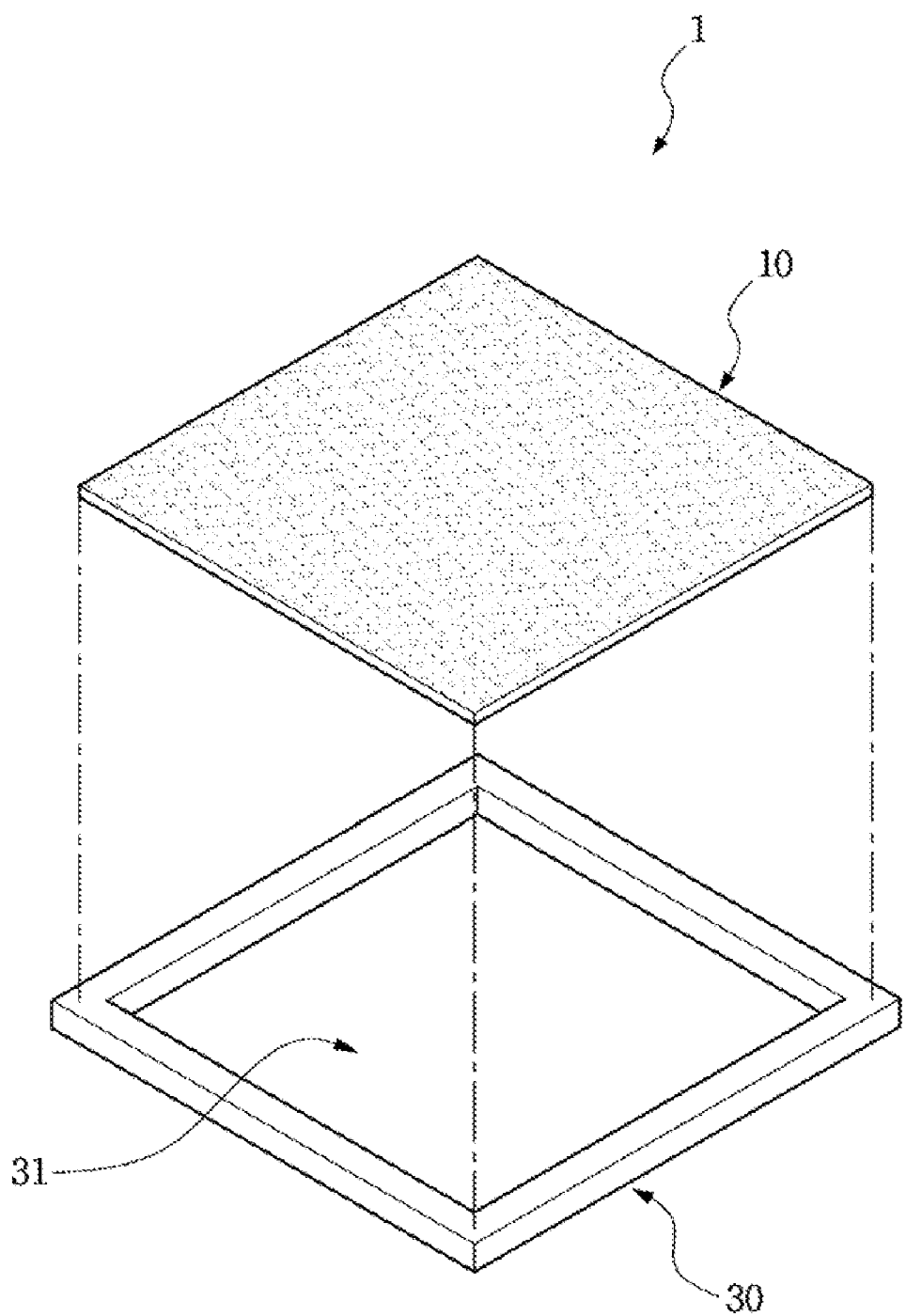
FIGS. 1 and 2 are an exploded perspective view and an assembled plan view of a mask according to an exemplary embodiment of the present invention, respectively.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Figure 2:
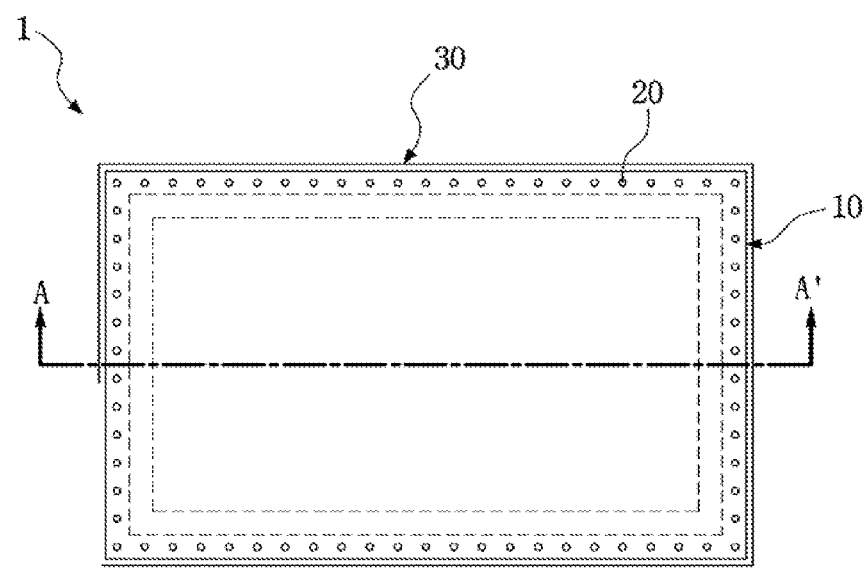
Figure 3:
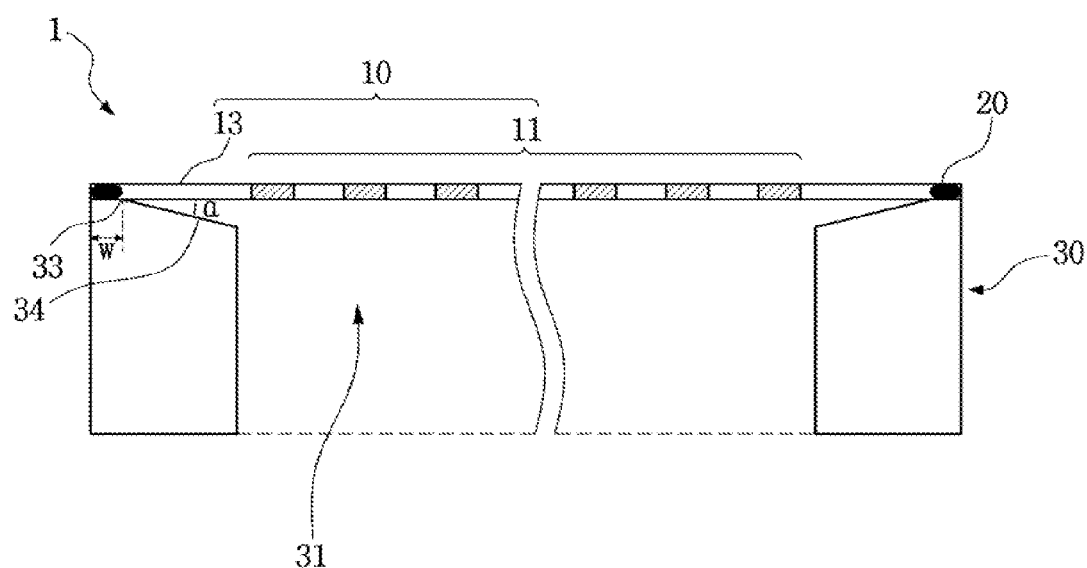
FIG. 3 is a cross-sectional view taken along line A-A' of FIG. 2.

FIGS. 1 and 2 are respectively an exploded perspective view and an assembled plan view of a mask 1, according to an exemplary embodiment of the present invention. FIG. 3 is a cross-sectional view taken along line A-A' of FIG. 2. Referring to FIGS. 1-3, the mask 1 includes a mask sheet 10 having a predetermined pattern, and a frame 30 in contact with, and fixed to, the perimeter of the mask sheet 10.

The frame 30 and mask sheet 10 are shown as being generally rectangular. However, the frame 30 and the mask sheet 10 may be circular or polygonal, so long as the shapes of the frame 30 and the mask sheet 10 correspond.

The frame 30 has a contact surface 33 and a non-contact surface 34, both of which generally face the mask sheet 10. The contact surface 33 is attached to the mask sheet 10 and extends generally parallel to the plane of the mask sheet 10. An opening 31 is defined in the center of the frame 30. The non-contact surface 34 extends from the contact surface 33, toward the opening 31. The non-contact surface 34 is disposed at an angle (angle $\alpha$), with respect to the plane of the mask sheet 10. In particular, the non-contact surface 34 slopes, such that a first edge of the non-contact surface 34, which is disposed adjacent to the contact surface 33, is closer to the mask sheet 10 than an opposing second edge of the non-contact surface 34, which is disposed adjacent to the opening 31. The non-contact surface 34 may have a larger area than the contact surface 34.

The angle $\alpha$ of the non-contact surface 34 is generally set such that contaminants disposed on the non-contact surface 34 do not contact the mask sheet 10, and thereby form a protrusion in the mask sheet 10. For this reason, the angle $\alpha$ of the non-contact surface 34 can be selected by those skilled in the art, according to a working environment. For example, the angle $\alpha$ is generally less than 90 degrees, such that the non-contact surface 34 faces towards the mask sheet 10.

The mask sheet 10 may be divided into an array region 11 having the predetermined pattern, and a non-array region 13 disposed around the array region 11, which does not have a predetermined pattern. An edge of the non-array region 13 is in contact with, and is fixed to, the frame 30. In particular, the perimeter of the non-array region 13 is fixed to the contact surface 33 of the frame 30.

A method of forming the mask 1 will now be described. First, the array region 11 of the mask sheet 10 is aligned with the opening 31 of the frame 30.

After that, a force is applied to the mask sheet 10, such that the perimeter of the mask sheet 10 is pressed against the contact surface 33. The mask sheet 10 is then fixed to the frame 30, by welding the mask sheet 10 to the contact surface 33. As shown in FIG. 2, the welding may be performed by forming welding points 20.

The contact surface 33 is directly fixed to the mask sheet 10. When the width W of the contact surface 33 is too small, it may be difficult to perform the welding. In addition, when the width W of the contact surface 33 is too large, problems may arise, due to contaminants being inserted between the mask sheet 10 and the contact surface 33. Thus, the width W of the contact portion 33a may be properly selected by those skilled in the art, according to a method of fixing the mask sheet 10 to the frame 30, or a working environment. In particular, the width W may be larger than that of the welding points 20.

Figure 4:
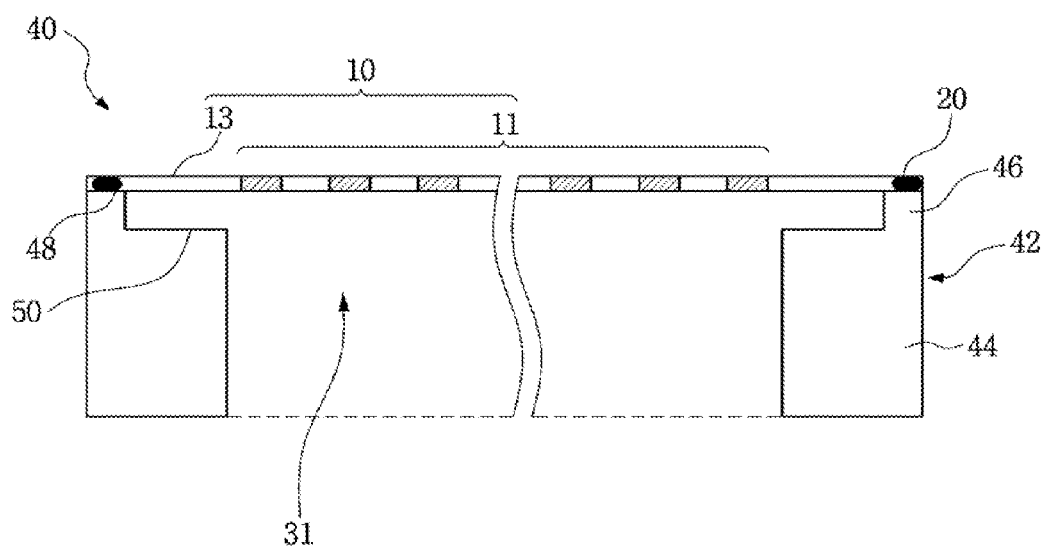
FIG. 4 is a cross-sectional view of a mask, according to another exemplary embodiment of the present invention.

FIG. 4 is a cross-sectional view of a mask 40, according to another exemplary embodiment of the present invention. Referring to FIG. 4, the mask 40 includes a mask sheet 10 and a frame 42. Elements similar to those of the mask 1 are not described in detail. The frame 42 includes a main body 44 and a projection 46 that extends from the main body 44.

The projection has a contact surface 48 that is welded to the perimeter of the mask sheet 10, by welding points 20, for example. The contact surface 48 extends parallel to the plane of the mask sheet 10. The main body 44 has a non-contact surface 50 that faces, and is spaced apart from, the mask sheet 10. In particular, the contact surface 48 and the non-contact surface 50 form a stepped structure. Because the non-contact surface 50 is spaced apart from the contact surface 48, the non-contact surface does not contact the mask sheet 10.

Accordingly, even if contaminants are disposed between the mask sheet 10 and the non-contact surface 50, the contaminants do not form protrusions on the mask sheet 10. Therefore, the mask sheet 10 remains flat, and there is a secure bond between the mask 10 and the frame 42, thereby enabling fine pattern depositions.

According to the present disclosure, the formation of a gap between a mask and a deposition substrate may be prevented, by preventing the insertion of contaminants between a mask frame and a mask sheet. Thus, the adhesion between the mask and the deposition substrate may be improved, and a fine pattern deposition is possible.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A deposition mask, comprising:
   a mask sheet; and
   a frame to support an entire perimeter of the mask sheet, the frame having
      a contact surface near an outer periphery of the frame that is fixed to the mask sheet along the entire perimeter of the mask sheet, and
      a non-contact surface that faces and is spaced apart from the mask sheet, the non-contact surface being disposed between the contact surface and an opening formed in the center of the frame, wherein the non-contact surface forms an acute angle with respect to a plane of the mask sheet.

2. The deposition mask according to claim 1, wherein the mask sheet comprises:
   a patterned array region; and
   a non-array region disposed around the array region, the non-array region being fixed to the contact surface.

3. The deposition mask according to claim 2, wherein the frame comprises:
   a main body that forms the non-contact surface; and
   a projection that extends from the main body and forms the contact surface, such that the frame has a sloped structure.

4. A deposition mask, comprising:
   a mask sheet; and
   a frame to support an entire perimeter of the mask sheet, the frame having
      a contact surface near an outer periphery of the frame that is fixed to the mask sheet along the entire perimeter of the mask sheet, and
      a non-contact surface that has a first edge that is disposed adjacent to the contact surface, and an opposing second edge that is disposed adjacent to an opening formed in the frame, wherein the first edge being closer to the mask sheet than the second edge, wherein the non-contact surface forms an acute angle with respect to a plane of the mask sheet.

5. The deposition mask according to claim 4, wherein the mask sheet comprises:
   a patterned array region; and
   a non-array region disposed around the perimeter of the array region, the non-array region being fixed to the contact surface.

6. The deposition mask according to claim 4, wherein the width of the contact surface is greater than the width of welding points that connect the mask sheet to the frame.

7. The deposition mask according to claim 6, wherein the area of the non-contact surface is greater than the area of the contact surface.

8. A deposition mask, comprising:
   a mask sheet; and
   a frame to support an entire perimeter of the mask sheet, having a contact surface near an outer periphery of the frame that is fixed to the mask sheet along the entire perimeter of the mask sheet, and a non-contact surface disposed between the contact surface and an opening formed in the center of the frame, the non-contact surface being spaced apart from the mask sheet, wherein the non-contact surface is parallel to a plane of the mask sheet.

9. The deposition mask according to claim 8, wherein the frame comprises:
   a main body that forms the non-contact surface; and
   a projection that extends from the main body towards the mask sheet, the projection forming the non-contact surface.

10. The deposition mask according to claim 8, wherein the mask sheet comprises:
   a patterned array region; and
   a non-array region disposed around the perimeter of the array region, the non-array region being fixed to the contact surface.

11. The deposition mask according to claim 8, wherein the width of the contact surface is greater than the width of welding points that connect the mask sheet to the frame.

12. The deposition mask according to claim 8, wherein the area of the non-contact surface is greater than the area of the contact surface.

* * * * *